United States Patent
Hart et al.

(10) Patent No.: US 6,613,687 B2
(45) Date of Patent: Sep. 2, 2003

(54) REVERSE REACTIVE ION PATTERNING OF METAL OXIDE FILMS

(75) Inventors: Brian Christopher Hart, Georgetown, KY (US); James Michael Mrvos, Lexington, KY (US); Carl Edmond Sullivan, Stamping Ground, KY (US); Gary Raymond Williams, Lexington, KY (US); Qing Ming Wang, Pittsburgh, PA (US)

(73) Assignee: Lexmark International, Inc., Lexington, KY (US)

( * ) Notice: Subject to any disclaimer, the term of this patent is extended or adjusted under 35 U.S.C. 154(b) by 228 days.

(21) Appl. No.: 09/820,045

(22) Filed: Mar. 28, 2001

(65) Prior Publication Data

US 2002/0142609 A1 Oct. 3, 2002

(51) Int. Cl.⁷ .............................. H01L 21/302
(52) U.S. Cl. .............. 438/710; 438/712; 438/720; 438/722; 438/725; 438/742
(58) Field of Search ................ 438/710, 712, 438/720, 722, 725, 742

(56) References Cited

U.S. PATENT DOCUMENTS

| 5,185,055 | A |   | 2/1993  | Temple et al. |         |
|-----------|---|---|---------|---------------|---------|
| 5,382,320 | A |   | 1/1995  | Desu et al.   |         |
| 5,549,784 | A |   | 8/1996  | Carmody et al.|         |
| 5,633,209 | A |   | 5/1997  | Leedy         |         |
| 6,004,874 | A | * | 12/1999 | Cleeves       | 438/622 |
| 6,008,135 | A | * | 12/1999 | Oh et al.     | 438/720 |
| 6,019,458 | A |   | 2/2000  | Shimada et al.|         |
| 6,022,752 | A |   | 2/2000  | Hirsh et al.  |         |
| 6,028,389 | A |   | 2/2000  | Bernstein     |         |
| 6,051,369 | A | * | 4/2000  | Azuma et al.  | 430/312 |
| 6,126,279 | A |   | 10/2000 | Shimada et al.|         |
| 6,140,746 | A | * | 10/2000 | Miyashita et al.| 310/358 |
| 6,362,558 | B1| * | 3/2002  | Fukui         | 310/358 |
| 6,402,303 | B1| * | 6/2002  | Sumi          | 347/68  |

FOREIGN PATENT DOCUMENTS

GB        2340305 A1    2/2000

OTHER PUBLICATIONS

US 6,117,746, 9/2000, Yoo (withdrawn)

* cited by examiner

Primary Examiner—Benjamin L. Utech
Assistant Examiner—Binh X. Tran
(74) Attorney, Agent, or Firm—Luedeka, Neely & Graham, PC

(57) ABSTRACT

The invention provides a method for making thin film metal oxide actuator device. According to the method a first conductive layer is deposited on a silicon substrate. Next a thin film metal oxide layer is deposited on the first conductive layer. A negative photoresist material is applied to the metal oxide layer to provide a photoresist layer. The photoresist layer is patterned using light radiation energy and developed to provide one or more exposed portions of the metal oxide layer. The photoresist layer is etched with a reactive ion plasma sufficient to remove the photoresist layer and the metal oxide layer under the photoresist layer from the first conductive layer leaving the one or more exposed portions of metal oxide layer on the first conductive layer. A second conductive layer is attached to the metal oxide layer to provide a thin film metal oxide actuator device. The method may be practiced without the use of more dangerous or hazardous wet chemical etching techniques which may provide undesirable undercutting of the metal oxide layers or may leave contaminants on the patterned metal oxide layers.

19 Claims, 2 Drawing Sheets

REVERSE REACTIVE ION PATTERNING OF METAL OXIDE FILMS

FIELD OF THE INVENTION

The invention relates to semiconductor fabrication techniques and in particular to improved manufacturing techniques for making ferroelectric actuator devices for ink jet printheads.

BACKGROUND

Ink jet printers continue to be improved as the technology for making the printheads continues to advance. New techniques are constantly being developed to provide low cost, highly reliable printers which approach the speed and print quality of laser printers. An added benefit of ink jet printers is that color images can be produced at a fraction of the cost of laser printers with as good or better quality than laser printers. All of the foregoing benefits exhibited by ink jet printers have also increased the competitiveness of suppliers to provide comparable printers in a more cost efficient manner than their competitors.

The primary components of the ink jet printhead are a semiconductor chip, a nozzle plate and a flexible circuit attached to the chip. The semiconductor chip is preferably made of silicon and contains various passivation layers, conductive metal layers, resistive layers, insulative layers and protective layers deposited on a device side thereof.

There are two primary types of ink jet printheads namely, thermal ink jet printheads and piezoelectric ink jet printheads. The piezoelectric printhead contains a thin film metal oxide which is widely used for many electromechanical applications. Examples of such electromechanical applications include surface acoustic wave devices, high frequency ultrasonic transducers and high speed ink jet printheads, just to name a few.

As electronic devices are improved, there is a need for an increased number of actuator devices such as the electromechanical devices described above which are more closely packed on a semiconductor substrate. Currently, wet etching of the metal oxide film is practiced, however, wet etching often results in undesirable undercutting of the oxide film and may leave etching residues which may contaminate the finished product. Also, hazardous materials such as hydrofluoric acid must be used. Accordingly, there continues to be a need for improved manufacturing techniques for microelectronic devices.

SUMMARY OF THE INVENTION

The invention provides a method for making thin film metal oxide actuator device. According to the method a first conductive layer is deposited on a silicon substrate. Next a thin film metal oxide layer is deposited on the first conductive layer. A negative photoresist material is applied to the metal oxide layer to provide a photoresist layer. The negative photoresist material contains components which are sufficient to form species which are reactive with the metal oxide layer during a dry etching process. The photoresist layer is patterned using light radiation energy and developed to provide one or more exposed portions of the metal oxide layer. The photoresist layer is etched with a reactive ion plasma sufficient to remove the photoresist layer and the metal oxide layer under the photoresist layer from the first conductive layer leaving the one or more exposed portions of metal oxide layer on the first conductive layer. A second conductive layer is attached to the metal oxide layer to provide a thin film metal oxide actuator device.

In another aspect the invention provides a reverse reactive ion etching process for making piezoelectric devices for ink jet printheads. The process includes providing a silicon wafer, depositing an insulating film layer on the silicon wafer, depositing a metal conductive layer on the insulating film layer, applying a metal oxide film to the conductive layer to provide a metal oxide layer, spin-coating a negative photoresist material on the metal oxide layer, drying or curing the photoresist material to provide a photoresist layer, the photoresist layer containing components which are sufficient to form species which are reactive with the metal oxide layer during a dry etch process, exposing the photoresist layer to light radiation energy through a mask to provide a patterned photoresist layer, developing the patterned photoresist layer to provide one or more exposed portions of the metal oxide layer, one or more remaining portions of photoresist layer covering the metal oxide layer, dry etching the remaining portions of photoresist layer using a reactive plasma gas which is sufficient to react with the photoresist layer and metal oxide layer covered by the photoresist layer without substantially etching the exposed portions of metal oxide layer.

An advantage of the invention is the technique may be used with metal oxide films having thickness' above about 1 micron without significantly increasing manufacturing time. The method may also be practiced without the use of wet chemical etching techniques which may providing undesirable undercutting of the metal oxide layers or may leave contaminants on the patterned metal oxide layers. Also, the methods of the invention are relatively safer to use since the methods avoid the use of hazardous chemicals such as hydrofluoric acid, buffered oxide etchant and the like and may provide products at lower operating costs.

BRIEF DESCRIPTION OF THE DRAWINGS

Further features and advantages of the invention will become apparent by reference to the detailed description when considered in conjunction with the figures, which are not to scale, wherein like reference numbers indicate like elements through the several views, and wherein.

DETAILED DESCRIPTION OF THE INVENTION

Figure 1:
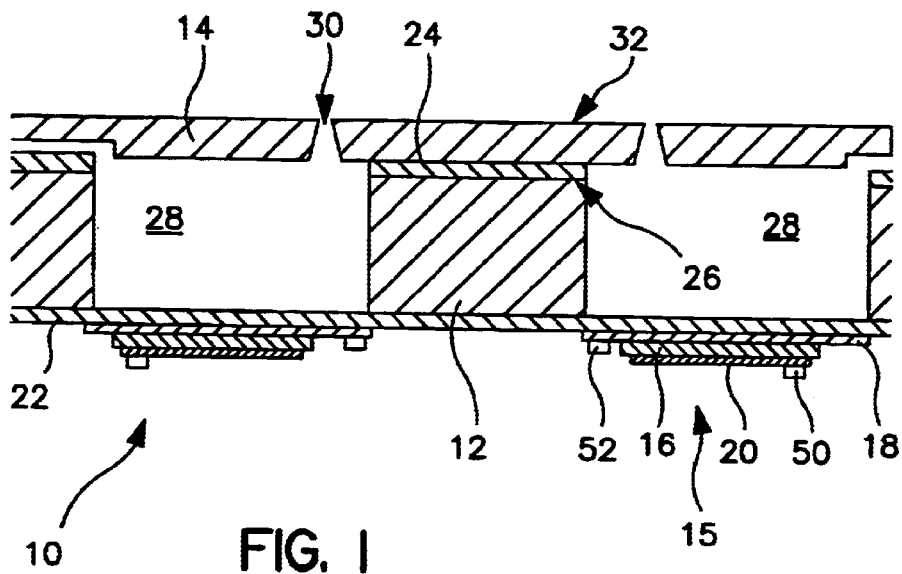
FIG. 1 is a cross-sectional end view, not to scale, of an ink jet printhead containing a patterned metal oxide layer made according to the invention.

With reference to FIG. 1, there is shown a representation of a portion of an ink jet printhead 10 in cross-section, not to scale, viewed from one end thereof. The printhead 10 includes a semiconductor substrate 12, a nozzle plate 14 and a ferroelectric actuator 15 including a metal oxide layer 16, a first conductive layer 18 and a second conductive layer 20. The ferroelectric actuator 15 is formed on the surface of an insulating layer 22 which is deposited on the semiconductor substrate 12. The nozzle plate 14 is attached by means of an adhesive 24 to a surface 26 of the semiconductor substrate 12 opposite the ferroelectric actuator 15.

The semiconductor substrate 12 is preferably a silicon semiconductor substrate containing a plurality of ferroelectric actuators 15. Each actuator 15 is opposite a pressurizing chamber 28 formed in the semiconductor substrate 12. The pressurizing chambers 28 contain ink and upon activation of the actuators 15, ink supplied through an ink via (not shown) in the semiconductor substrate 12 is caused to be ejected toward a print media through nozzle holes 30 in nozzle plate 14 by flexing of diaphragms defined by insulating layer 22 and first conductive layer 18 opposite the pressurizing chambers 28. The combined thickness of the insulating layer 22 and first conductive layers 18 preferably ranges from about 2 to about 10 microns.

The semiconductor substrates 12 for a printhead 10 are relatively small in size and typically have overall dimensions ranging from about 10 to about 30 millimeters wide by about 10 to about 30 millimeters long and from about 200 to about 800 microns thick. Each ferroelectric actuator 15 may have a wide range of dimensions depending on number and size of pressurizing chambers 28 in the semiconductor substrate 12. For example, a preferred ferroelectric actuator 15 for an ink jet printer has dimensions of from about 40 to about 150 microns wide by from about 1 to about 6 mm long. The thickness of the actuator 15 preferably ranges from about 1 to about 20 microns.

In conventional semiconductor substrates 12, slot-type ink vias for supplying ink to the ink chambers 28 are grit-blasted in the semiconductor substrates 12. Such vias typically have dimensions of about 10 millimeters long and 0.4 millimeters wide.

During a printing operation, electrical impulses are applied to one or more of the ferroelectric actuators 15 causing flexing of the insulating layer 22 and first conducting layer 18 below the ferroelectric actuator 15. The insulating layer 22 and first conducting layer 18 flex into pressurizing chambers 28 a distance sufficient to pressurize the ink in chambers 28 and urge pressurized ink through nozzle holes 30 toward a print media.

Figure 2:
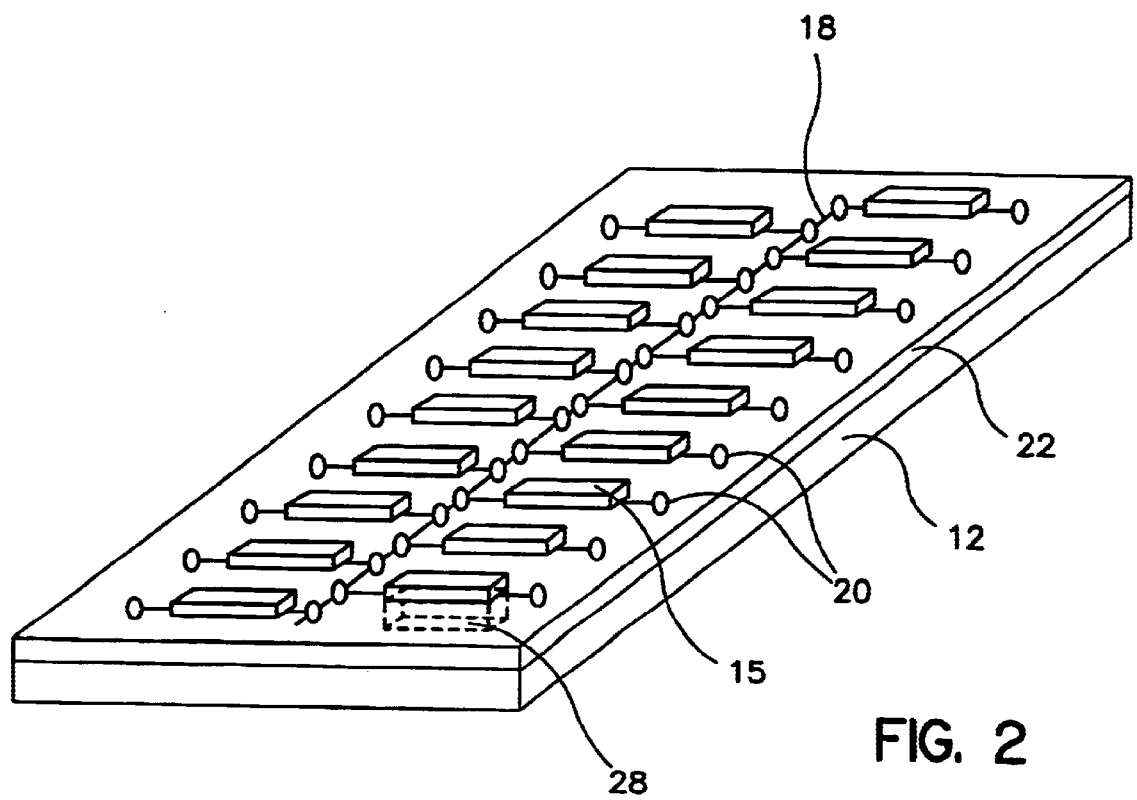
FIG. 2 is a perspective view of a semiconductor chip for an ink jet printhead, from a device side thereof, containing a patterned metal oxide layer made according to the invention.

Each printhead 10 preferably contains a plurality of pressurizing chambers 28 and associated ferroelectric actuators 15. A view of a printhead 10 from the device side thereof is shown in FIG. 2. As seen in FIGS. 1 and 2, a single one of the pressurizing chambers 28 is associated with each ferroelectric actuator 15 disposed on the insulating layer 22 and semiconductor substrate 12. Accordingly, there are preferably as many pressurizing chambers 28 as ferroelectric actuators 15 on the printhead 10. Each of the ferroelectric actuators 15 preferably has substantially the same dimensions as the length and width of the pressurizing chambers 28. Accordingly each actuator 15 has a width ranging from about 50 to about 200 microns and a length ranging from about 1 to about 5 mm.

The metal oxide layer 16 is sandwiched between the first conducting layer 18 and the second conducting layer 20. The first conducting layer 18 is preferably a common conducting layer 18 connecting a plurality of ferroelectric actuators 15 together on the substrate 12. The metal oxide layer 16 is provided by a material selected from the group consisting of lead zirconate titanate, lead magnesium niobate-lead titanate, lead nickel niobate-lead titanate, lead zinc niobate-lead titanate, lead tungstate magnesium, lead zirconate, lead titanate, barium titanate, lanthanum doped lead zirconate titanate, lead magnesium niobate-lead titanate, lead zirconium niobate-lead titanate, lithium niobate, lithium tantalate, zinc oxide, zirconia, alumina, magnesia and superconducting oxide. The first conducting layer 18 is provided by a material selected from the group consisting of titanium and/or platinum and the second conducting layer 20 is provided by a material selected from the group consisting of platinum, aluminum, copper or any other conducting material. A preferred conducting layer 18 is a platinum/titanium layer which is deposited over a silicon dioxide insulating layer 22 on the semiconductor substrate 12.

The nozzle plate 14 is adhesively attached by means of a UV-curable or heat curable epoxy adhesive 24 to surface 26 of the semiconductor substrate 12 or to a passivation layer (if present) on surface 26 of the semiconductor substrate 12. This is preferably done after the steps of forming the pressurizing chambers 28 and ink feed vias in the semiconductor substrate 12 and after forming the ferroelectric actuators 15. The adhesive 24 used to attach the nozzle plate 14 to surface 26 or a passivation layer on surface 26 is preferably a heat curable adhesive such as a B-stageable thermal cure resin, including, but not limited to phenolic resins, resorcinol resins, epoxy resins, ethylene-urea resins, furane resins, polyurethane resins and silicone resins. The adhesive 24 preferably has a thickness ranging from about 1 to about 25 microns. A particularly preferred adhesive is a phenolic butyral adhesive which is cured by heat and pressure.

The nozzle plate 14 contains a plurality of the nozzle holes 30 each of which are in fluid flow communication with a pressurizing chamber 28. The nozzle plate 14 is made of a material selected from metal such as nickel or a polymeric material such as a polyimide available from Ube Industries, Ltd of Tokyo, Japan under the trade name UPILEX. A preferred material for the nozzle plate 14 is a polymeric material and the nozzle holes 30 are made such as by laser ablating the polymeric material. A particularly preferred nozzle plate material is polyimide which may contain an ink repellent coating on surface 32 thereof (FIG. 1).

Figure 3:
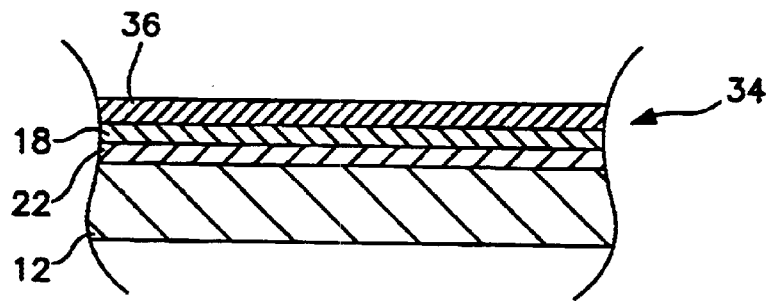
FIGS. 3–6 are cross-sectional side views of a semiconductor substrate containing a metal oxide layer illustrating steps in a preferred method for patterning the metal oxide layer according to the invention.
Figure 4:
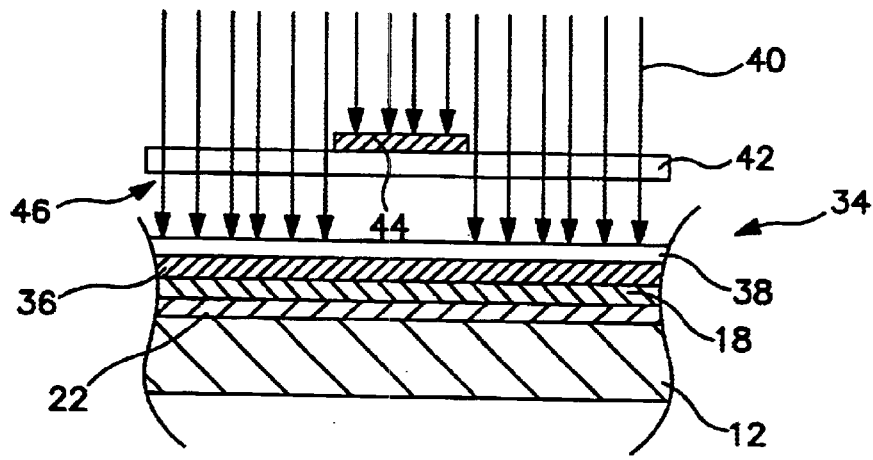

With reference to FIGS. 3–6, a preferred method for making ferroelectric actuators 15 according to the invention will now be described. A portion of a silicon wafer 34 providing a plurality semiconductor substrates 12 is shown in FIG. 3. In order to provide passivation and/or insulation between the ferroelectric actuator 15 and the substrate 12, a passivation or insulating layer 22 is applied to the wafer 34. The passivation or insulating layer 22 may be selected from $SiO_2$, a photoresist material, and metal oxides, i.e., tantalum oxide and the like. In the case of $SiO_2$ insulating layer 22, the insulating layer 22 is preferably applied to the silicon wafer 34 by a thermal growth method, sputtering or spin-coating the insulating layer 22 on the silicon wafer 34.

The passivation or insulating layer 22 is relatively thin compared to the thickness of the silicon wafer 34. However, the passivation or insulating layer 22 should be thick enough to prevent diffusion and electrical conduction therethrough. Accordingly, the thickness of insulating layer 22 may range from about 0.1 to about 10 microns, preferably from about 0.5 to about 5 microns.

A first conducting layer 18, preferably including titanium and platinum and a piezoelectric layer 36, preferably a layer of a piezoelectric lead zirconate titanate (PZT) ceramic material, are applied to the passivation layer 22. The passivation layer 22 acts as an etch stop layer and as a supporting layer for the conducting layer 18 and PZT layer 36. The conducting layer 18 may be sputtered onto or deposited by chemical vapor deposition (CVD) on the passivation layer 22 to provide a ground plane for an electric circuit for the PZT layer 36. Conducting layer 18 preferably has a thickness ranging from about 0.15 to about 1.5 micron, most preferably from about 0.5 to about 1 micron.

The PZT layer 36 is deposited on the conducting layer 18 as by sol-gel spin coating, sputtering or a metal organic chemical vapor deposition (MOCVD) technique. PZT layer 36 preferably has a thickness ranging from about 1 to about 15 microns, preferably from about 2 to about 10 microns.

Next, a photo-imageable polymer material is spin-coated onto the PZT layer 36. The photo-imageable polymer material is dried or cured to provide a reverse masking layer or a photoresist layer 38 which provides reverse masking properties. Drying or curing may be conducted by baking the wafer containing insulating layer 22, first conductive layer 18, PZT layer 36 and photoresist polymer layer 38. The photo-imageable polymer material is preferably a negative photoresist material. Such material includes, but is not limited to, that available from Shell Chemical Company of Houston, Tex. under the trade name EPON. A preferred photoresist material includes from about 10 to about 20 percent by weight difunctional epoxy compound, less than about 4.5 percent by weight multifunctional crosslinking epoxy compound, from about 1 to about 10 percent by weight photoinitiator capable of generating a cation and from about 20 to about 90 percent by weight non-photoreactive solvent as described in U.S. Pat. No. 5,907,333 to Patil et al., the disclosure of which is incorporated by reference herein as if fully set forth.

Because the layer 38 is preferably spin-coated onto the PZT layer 36 from a solution containing the photo-imageable polymer material, the thickness of the layer 38 may be varied within wide limits. Accordingly, layer 38 may be provided with a thickness ranging from about 0.1 to about 40 microns.

Figure 5:
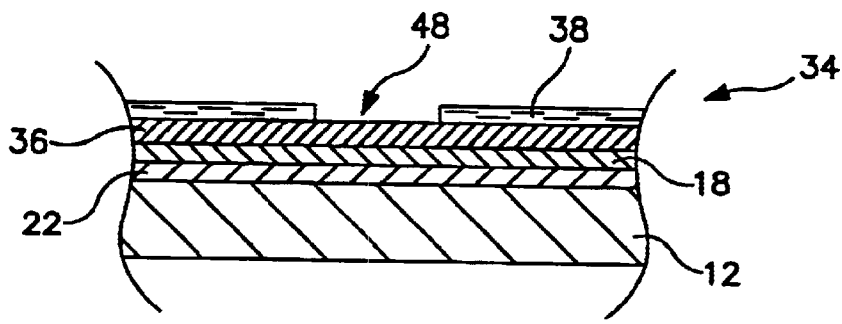
Figure 6:
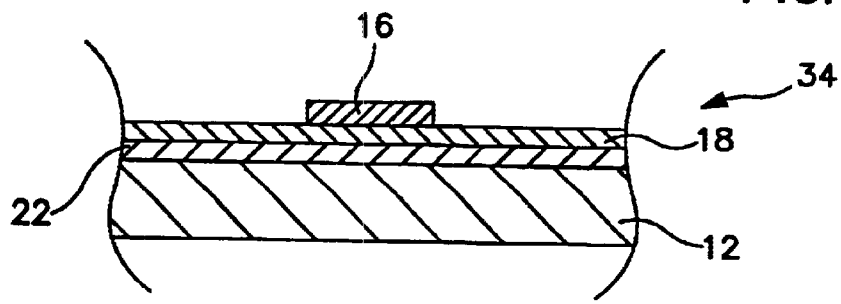

After the drying or curing step, the photoresist layer 38 is exposed to a light source such as ultraviolet (UV) radiation 40 through a first mask 42 having opaque areas 44 and transparent areas 46. The light source preferably has radiation energy sufficient to react with the photoresist layer 38 to pattern the layer 38 in order to define portions of the photoresist layer 38 which will remain on the PZT layer 36 after developing. The photoresist layer 38 is developed by dissolving the unexposed polymer material used to provide the layer 38, i.e., the portions shielded from UV radiation 40 by the opaque portions 44 of the mask 42, in a developer solution leaving portions of the exposed polymer layer 38 on the PZT layer 36. As shown in FIG. 5, once the exposed polymer layer 38 is developed, one or more exposed portions 48 of the PZT layer 36 are provided. The remaining portions of the PZT layer 36 remain covered by the polymer layer 38.

The wafer 34 is next placed in a reactive ion etcher to conduct a "reverse reactive ion etching" of the PZT layer 36. "Reverse reaction ion etching" means that only the portions of the PZT layer 36 covered by the polymer layer 38 are etched while the exposed portions 48 of the PZT layer remains substantially unetched. The PZT layer 36 not etched in the exposed portion 48 provides metal oxide layer 16 shown in FIG. 6.

Reverse reactive ion etching is preferably conducted using a reactive gas or mixture of reactive gases containing fluorine. Preferred reactive gases include, but are not limited to, trifluoromethane, difluoromethane, fluoromethane, carbon tetrafluoride, carbon tetrafluoride/hydrogen mixture, sulfur hexafluoride and a mixture of sulfur hexafluoride and hydrogen, trifluoromethane, difluoromethane or fluoromethane. While not desiring to be bound by theory, it is believed that plasma in the reactive ion etcher forms ultraviolet light which reacts with or causes photolysis of excess cationic polymerization initiator in the photoresist layer 38 and forms hydrogen fluoride and/or other reactive species in situ in the photoresist layer. The hydrogen fluoride is believed to act as an in situ etchant to etch the PZT layer 36 in the areas covered by the photoresist layer 38 at substantially the same time the photoresist layer 36 is being etched.

After the photoresist layer 38 is substantially completely consumed and the PZT layer 36 under the photoresist layer 38 is etched away, the fluorine radicals may continue to etch the conductive layer 18 and the insulative layer 22. Therefore etch conditions and times must be closely controlled to terminate the etching process once the PZT layer 36 under the photoresist layer 38 is completely etched away.

The preferred conditions for RIE etching of the PZT layer 36 include a reactive ion etcher chamber pressure preferably ranging from about 100 milliTorr to about 600 milliTorr, a preferred reaction gas of carbon tetrafluoride, gas flow rates preferably ranging from about 20 standard cubic centimeters per minute (sccm) to about 200 sccm, an etch time preferably ranging from about 5 minutes to about 2 hours and a reactive ion etcher power preferably ranging from about 200 to about 600 watts. Particularly preferred conditions are about 40 minutes at about 400 watts power, about 41 sccm and a pressure ranging from about 250 to about 270 milliTorr. A preferred etcher is a MARCH CS-1701 reactive ion etcher available from March Instruments of Concord, Calif., a subsidiary of Nordsen Plasma Systems.

After forming the metal oxide layer 16, the second conductive layer 20 is sputtered on top of the metal oxide layer 16. The second conductive layer 20 preferably has a thickness ranging from about 0.15 to about 1.0 micron, most preferably from about 0.5 to about 1.0 micron. In order to define contact with the individual ferroelectric actuators 15, the second conductive layer 20 is patterned by reactive ion etching or chemical etching using an appropriate metal etchant. A portion of the second conductive layer 20 terminates in contact pads 50 and a portion of the first conductive layer 18 terminates in contact pads 52 for connection to the flexible circuit or TAB circuit for applying an electric field across the ferroelectric actuators 15 (FIG. 1).

In the case of ferroelectric actuators 15 made by the foregoing process for use as ink ejection devices for ink jet printheads as shown in FIG. 1, pressurizing chambers 28 are next formed in the semiconductor substrate 12. Depending on the thickness of the semiconductor substrate 12, the pressurizing chambers 28 may be formed by a wide variety of micromachining methods including wet chemical etching, dry etching, laser machining and the like. A preferred method for forming pressurizing chambers 28 in a semiconductor substrate 12 is a dry etch technique such as deep reactive ion etching (DRIE). The DRIE etch technique employs an etching plasma comprising an etching gas derived from fluorine compounds such as sulfur hexafluoride ($SF_6$), tetrafluoromethane ($CF_4$) and trifluoroamine ($NF_3$). A particularly preferred etching gas is $SF_6$. A passivating gas is also used during the etching process. The passivating gas is derived from a gas selected from the group consisting of trifluoromethane ($CHF_3$), tetrafluoroethane ($C_2F_4$), hexafluoroethane ($C_2F_6$), difluoroethane ($C_2H_2F_2$), octofluorobutane ($C_4F_8$) and mixtures thereof. A particularly preferred passivating gas is $C_4F_8$.

In the alternative, the pressuring chambers 28 may be patterned and formed in the semiconductor substrate 12 prior to forming the ferroelectric actuators 15 as described above. In this case, the pressurizing chamber locations in the semiconductor substrate 12 may be patterned and etched in the substrate 12 from either side thereof, the opposite side being provided with an etch stop material such as insulative layer 22. However, it is preferred to form the ferroelectric actuators 15 prior to forming the pressurizing chambers 28. In this case, a second photoresist layer is applied to the surface 26 of the semiconductor substrate 12 or to passivation layer on the substrate 12. The second photoresist layer is preferably applied with a thickness ranging from about 1 to about 40 microns, most preferably from about 16 to about 25 microns. The second photoresist layer is patterned to define the location of the pressurizing chambers 28, for example, by use of an ultraviolet light and a photomask. The pressurizing chamber locations are selected based on the locations of the ferroelectric actuators 15 by well known imaging techniques. The second photoresist layer applied to the semiconductor substrate on surface 26 thereof is imaged, developed and removed to define the locations on surface 26 for the pressurizing chambers 28.

The patterned structure is then placed in an etch chamber having a source of plasma gas and back side cooling such as with helium and water. It is preferred to maintain the patterned structure below about 400° C., most preferably in a range of from about 50° to about 100° C. during the etching process. In the process, a deep reactive ion etch (DRIE) of the silicon is conducted using an etching plasma derived from $SF_6$ and a passivating plasma derived from $C_4F_8$ wherein the substrate 12 is etched from the patterned side toward insulative layer 22 which contains the ferroelectric actuators 15. A protection passivation layer may be applied over the conductive layers 18 and 20 and the metal oxide layers 16 prior to etching the pressurizing chambers 28 in order to protect these layers and devices during the dry etching process.

During the etching process, the plasma is cycled between the passivating plasma step and the etching plasma step until the pressurizing chambers 28 are formed completely through the thickness of the semiconductor substrate 12 up to insulative layer 22. Cycling times for each step preferably range from about 5 to about 20 seconds for each step. Gas pressure in the etching chamber preferably ranges from about 15 to about 50 millitorr at a temperature ranging from about −20° to about 35° C. The DRIE, also known as Inductively Coupled Plasma or ICP, platen power preferably ranges from about 10 to about 25 watts and the coil power preferably ranges from about 800 watts to about 3.5 kilowatts at frequencies ranging from about 10 to about 15 MHz. Etch rates may range from about 2 to about 10 microns per minute or more and produce holes having side wall profile angles ranging from about 88° to about 92°. Etching apparatus is available from Surface Technology Systems, Ltd. of Gwent, Wales. Procedures and equipment for etching silicon are described in European Application No. 838,839A2 to Bhardwaj, et al., U.S. Pat. No. 6,051,503 to Bhardwaj, et al., PCT application WO 00/26956 to Bhardwaj, et al. When the insulative layer 18 or etch stop layer $SiO_2$ is reached, etching of the semiconductor substrate 12 terminates.

The same process, described above may be used to form the ink feed vias in the semiconductor substrate 12 and insulative layer 22 and/or passivation layer, if any, which vias are preferably formed at substantially the same time as the pressurizing chambers 28. The ink feed vias are located in the semiconductor substrate 12 remote from the pressurizing chambers 28 but provide ink flow communication between the pressurizing chambers 28 and an ink supply source. Each ink feed via has a diameter ranging from about 200 microns to about 2000 microns and a printhead containing 128 of the pressurizing chambers 28 may contain from about 1 to about 4 ink feed vias. As set forth above, the ink feed vias may also be slots formed by grit blasting or wet chemical etching techniques.

Methods for deep reactive ion etching (DRIE) are described in U.S. Pat. No. 6,051,503 to Bhardwaj, et al., incorporated herein by reference, in its entirety, as if fully set forth. Useful etching procedures and apparatus are also described in EP 838,839 to Bhardwaj et al., WO 00/26956 to Bhardwaj et al. and WO 99/01887 to Guibarra et al. Etching equipment is available from Surface Technology Systems Limited of Gwent, Wales.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A method for making thin film metal oxide actuator device comprising the steps of depositing a first conductive layer on a silicon substrate, depositing a thin film metal oxide layer on the first conductive layer, applying a negative photoresist material to the metal oxide layer to provide a photoresist layer, the negative photoresist material containing components sufficient to form species which are reactive with the metal oxide layer during a dry etch process, patterning and developing the photoresist layer using light radiation energy to provide one or more exposed portions of the metal oxide layer, etching the thus treated photoresist layer with a reactive ion plasma sufficient to remove the photoresist layer and the metal oxide layer under the photoresist layer from the first conductive layer leaving the one or more exposed portions of metal oxide layer on the first conductive layer and attaching a second conductive layer to the metal oxide layer to provide a thin film metal oxide actuator device.

2. The method of claim 1 wherein the metal oxide layer comprises a ferroelectric layer.

3. The method of claim 2 wherein the ferroelectric layer is selected from the group consisting of lead zirconate titanate, lead niobate magnesium, lead niobate nickel, lead niobate zinc, lead tungstate magnesium, lead zirconate, lead titanate, barium titanate, lanthanum doped lead zirconate titanate, lead magnesium niobate-lead titanate, lead zirconium niobate-lead titanate, lithium niobate, lithium tantalate, zinc oxide, zirconia, alumina, magnesia and superconducting oxide.

4. The method of claim 2 wherein the ferroelectric layer is deposited on the first conducting layer by one of sol-gel spin coating, sputtering and metal organic chemical vapor deposition (MOCVD).

5. The method of claim 1 wherein the metal oxide layer is deposited on the first conducting layer by one of sol-gel spin coating, sputtering and metal organic chemical vapor deposition (MOCVD).

6. The method of claim 1 wherein the photoresist layer and metal oxide layer are etched with a plasma gas which reacts with the photoresist material components to produce hydrofluoric acid (HF).

7. The method of claim 1 wherein the plasma gas is selected from the group consisting of trifluoromethane, difluoromethane, fluoromethane, carbon tetrafluoride, carbon tetrafluoride/hydrogen mixture, sulfur hexafluoride and a mixture of sulfur hexafluoride and hydrogen, trifluoromethane, difluoromethane or fluoromethane.

8. The method of claim 1 wherein the light radiation energy comprises ultraviolet (UV) light energy.

9. The method of claim 1 wherein the photoresist layer comprises a negative photoresist material containing a cationic polymerization catalyst.

10. The method of claim 1 wherein the photoresist layer comprises a negative photoresist layer catalyzed by a cationic polymerization catalyst containing a polymerization initiator which generates hydrofluoric acid under ultraviolet light.

11. A reverse reactive ion etching process for making piezoelectric devices for ink jet printheads, the process comprising, providing a silicon wafer, depositing an insulating film layer on the silicon wafer, depositing a metal conductive layer on the insulating film layer, applying a metal oxide film to the conductive layer to provide a metal oxide layer, spin-coating a negative photoresist material on the metal oxide layer, drying or curing the photoresist material to provide a photoresist layer, the photoresist layer containing components which are sufficient to form species which are reactive with the metal oxide layer during a dry etch process, exposing the photoresist layer to light radiation energy through a mask to provide a patterned photoresist layer, developing the patterned photoresist layer to provide one or more exposed portions of the metal oxide layer, one or more remaining portions of photoresist layer covering the metal oxide layer, dry etching the remaining portions of photoresist layer using a reactive plasma gas which is sufficient to react with the photoresist layer and metal oxide layer covered by the photoresist layer without substantially etching the exposed portions of metal oxide layer.

12. The method of claim 11 wherein the metal oxide layer comprises a ferroelectric layer.

13. The method of claim 12 wherein the ferroelectric layer is selected from the group consisting of lead zirconate titanate, lead niobate magnesium, lead niobate nickel, lead niobate zinc, lead tungstate magnesium, lead zirconate, lead titanate, barium titanate, lanthanum doped lead zirconate titanate, lead magnesium niobate-lead titanate, lead zirconium niobate-lead titanate, lithium niobate, lithium tantalate, zinc oxide, zirconia, alumina, magnesia and superconducting oxide.

14. The method of claim 12 wherein the ferroelectric layer is deposited on the first conducting layer by one of sol-gel spin coating, sputtering and metal organic chemical vapor deposition (MOCVD).

15. The method of claim 11 wherein the metal oxide layer is deposited on the first conducting layer by one of sol-gel spin coating, sputtering and metal organic chemical vapor deposition (MOCVD).

16. The method of claim 11 wherein the reactive plasma gas is selected from the group consisting of trifluoromethane, difluoromethane, fluoromethane, carbon tetrafluoride, carbon tetrafluoride/hydrogen mixture, sulfur hexafluoride and a mixture of sulfur hexafluoride and hydrogen, trifluoromethane, difluoromethane or fluoromethane.

17. The method of claim 11 wherein the light radiation energy comprises ultraviolet (UV) light energy.

18. The method of claim 11 wherein the photoresist layer comprises a negative photoresist material containing a cationic polymerization catalyst.

19. The method of claim 11 wherein the photoresist layer comprises a negative photoresist layer catalyzed by a cationic polymerization catalyst containing a polymerization initiator which generates hydrofluoric acid under ultraviolet light.

* * * * *